(12) United States Patent
Maruhashi

(10) Patent No.: US 11,930,135 B1
(45) Date of Patent: Mar. 12, 2024

(54) SIGNAL PROCESSING BOARD AND IMAGE FORMING APPARATUS

(71) Applicant: KYOCERA Document Solutions Inc., Osaka (JP)

(72) Inventor: Ken Maruhashi, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 18/466,786

(22) Filed: Sep. 13, 2023

(30) Foreign Application Priority Data

Sep. 14, 2022 (JP) ................................. 2022-145792

(51) Int. Cl.
*H04N 1/00* (2006.01)
*H01L 21/02* (2006.01)
*H01L 23/50* (2006.01)

(52) U.S. Cl.
CPC ... *H04N 1/00021* (2013.01); *H01L 21/02505* (2013.01); *H01L 23/50* (2013.01); *H01L 2223/6611* (2013.01)

(58) Field of Classification Search
CPC ......... H04N 1/00021; H04N 21/02505; H04N 23/50; H04N 2223/6611
See application file for complete search history.

(56) References Cited

U.S. PATENT DOCUMENTS

| | | | |
|---|---|---|---|
| 2012/0201087 A1 | 8/2012 | Mizuno et al. | |
| 2014/0070384 A1* | 3/2014 | Sugimoto | H01L 25/105 257/666 |
| 2014/0252612 A1* | 9/2014 | Nakagawa | H01L 23/12 361/764 |

FOREIGN PATENT DOCUMENTS

JP 2012164794 A 8/2012

* cited by examiner

*Primary Examiner* — Quang N Vo
(74) *Attorney, Agent, or Firm* — Alleman Hall & Tuttle LLP

(57) ABSTRACT

A signal processing board includes a six-layer substrate in which six wiring layers are stacked, and a first semiconductor element and a second semiconductor element mounted on the outer surface of a first layer of the six wiring layers. A plurality of signal transmission patterns are formed in the first layer, a third layer, a fourth layer, and a sixth layer of the six wiring layers. A first ground pattern is formed in a second layer. A second ground pattern is formed in a fifth layer. A first power supply pattern is formed in one of the fourth layer, the fifth layer, and the sixth layer. A second power supply pattern is formed in one of the fourth layer, the fifth layer, and the sixth layer.

4 Claims, 5 Drawing Sheets

SIGNAL PROCESSING BOARD AND IMAGE FORMING APPARATUS

INCORPORATION BY REFERENCE

This application is based upon and claims the benefit of priority from the corresponding Japanese Patent Application No. 2022-145792 filed on Sep. 14, 2022, the entire contents of which are incorporated herein by reference.

The present disclosure relates to a signal processing board and an image forming apparatus including a six-layer substrate.

BACKGROUND

An image forming apparatus such as a printer, a copier, or a multifunction peripheral is provided with a printing device and a signal processing board. Elements including a processor for controlling the printing device are mounted on the signal processing board.

For example, the signal processing board includes a multilayer substrate, and a processing unit and a memory element mounted on the multilayer substrate. A plurality of wiring patterns are formed in a plurality of wiring layers in the multilayer substrate.

The plurality of wiring patterns are electrically connected to one or both of the processing unit and the memory element. The demand for smaller and higher density signal processing boards has led to an increase in the number of layers of the multilayer substrate.

For example, it is known that the multilayer substrate of the signal processing board is a four-layer substrate or a six-layer substrate.

SUMMARY

A signal processing board according to one aspect of the present disclosure includes a six-layer substrate, a first semiconductor element and a second semiconductor element, a plurality of signal transmission patterns, a first ground pattern, a second ground pattern, a first power supply pattern, and a second power supply pattern. The six-layer substrate is a substrate in which six wiring layers are stacked. The first semiconductor element and the second semiconductor element are mounted on an outer surface of a first layer of the six wiring layers. The plurality of signal transmission patterns are formed in the first layer, a third layer, a fourth layer, and a sixth layer of the six wiring layers, and are electrically connected to one or both of the first semiconductor element and the second semiconductor element. The first ground pattern is formed in a second layer of the six wiring layers, and is electrically connected to the first semiconductor element and the second semiconductor element. The second ground pattern is formed in a fifth layer of the six wiring layers, and is electrically connected to the first semiconductor element and the second semiconductor element. The first power supply pattern is formed in one of the fourth layer, the fifth layer, and the sixth layer of the six wiring layers, and is electrically connected to the first semiconductor element. The second power supply pattern is formed in one of the fourth layer, the fifth layer, and the sixth layer of the six wiring layers, and is electrically connected to the second semiconductor element.

An image forming apparatus according to another aspect of the present disclosure includes a printing device configured to form an image on a sheet and the signal processing board on which a memory element and a processor configured to control the printing device are mounted.

This Summary is provided to introduce a selection of concepts in a simplified form that are further described below in the Detailed Description with reference where appropriate to the accompanying drawings. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
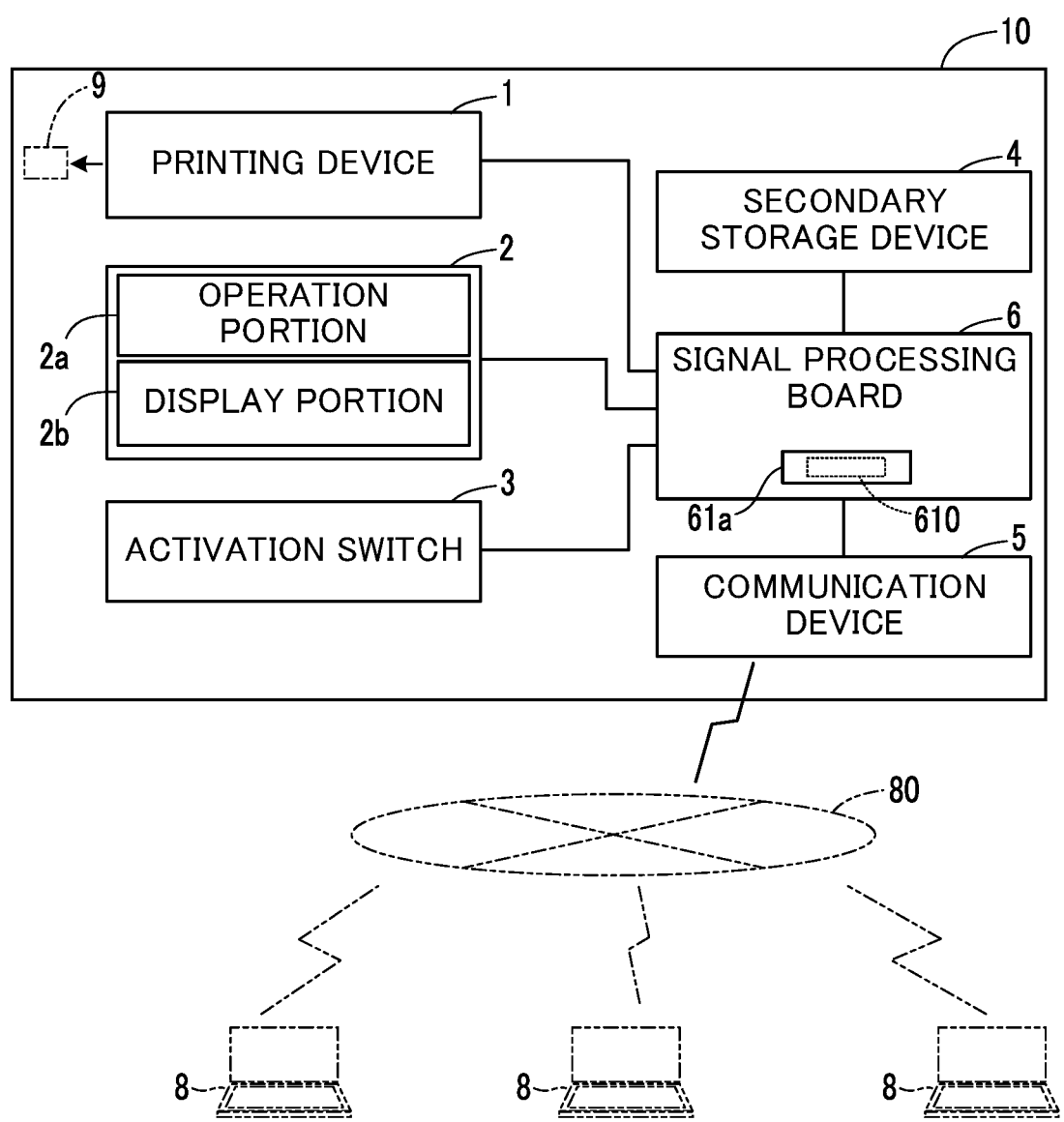
FIG. 1 is a block diagram showing a configuration of an image forming apparatus including a signal processing board according to an embodiment.

An embodiment of the present disclosure will be described below with reference to the drawings. It is noted that the following embodiment is an example of embodying the present disclosure and does not limit the technical scope of the present disclosure.

The signal processing board 6 according to the embodiment is a control board of an image forming apparatus 10. In the image forming apparatus 10, the signal processing board 6 is a board on which a processing unit 61a is mounted.

The processing unit 61a includes a processor 610 for controlling a printing device 1. The processing unit 61a is, for example, a system-on-a-chip (SoC) or a central processing unit (CPU).

[Configuration of Image Forming Apparatus 10]

The image forming apparatus 10 can communicate with one or more host devices 8 through a network 80 (see FIG. 1).

When receiving a print request from the host device 8, the image forming apparatus 10 executes print processing. The print processing is processing for forming an image on a sheet 9. For example, the image forming apparatus 10 is a printer, a copier, a facsimile machine, or a multifunction peripheral.

The image forming apparatus 10 includes a printing device 1, an operation unit 2, an activation switch 3, a secondary storage device 4, a communication device 5, and a signal processing board 6.

The printing device 1 executes the print processing. For example, the printing device 1 executes the print processing using an electrophotographic method or an inkjet method. The printing device 1 is an example of a printing portion.

The operation unit 2 is a human interface device such as a touch panel unit. The operation unit 2 includes an operation portion 2a and a display portion 2b. The operation portion 2a is a device that receives a human operation. The display portion 2b is a panel display device capable of displaying information.

The secondary storage device 4 is a computer-readable nonvolatile storage device. For example, one or both of a flash memory and a hard disk drive are employed as the secondary storage device 4.

The communication device 5 communicates with one or more host devices 8 through the network 80. The signal processing board 6 receives a processing request from the host device 8 and transmits a response to the host device 8 via the communication device 5.

The processor 610 of the signal processing board 6 executes various types of control and data processing by executing computer programs stored in the secondary storage device 4. For example, the processor 610 controls the printing device 1 and the display portion 2b.

Figure 2:
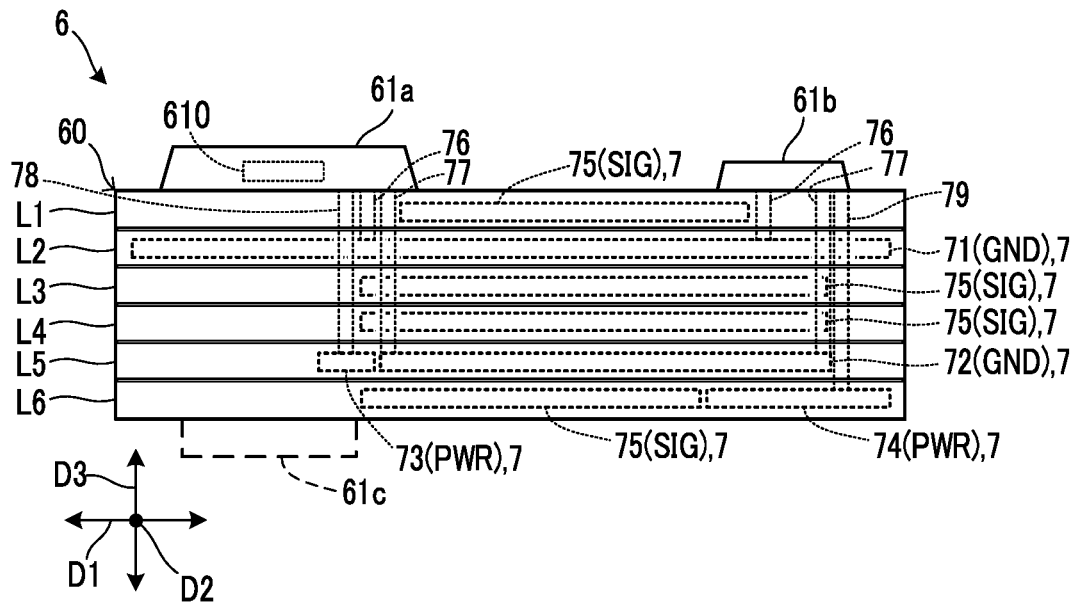
FIG. 2 is a diagram showing distribution of a plurality of wiring patterns among six wiring layers of the signal processing board according to the embodiment.

As shown in FIG. 2, the signal processing board 6 is provided with a six-layer substrate 60, the processing unit 61a, and the memory element 61b. For example, the memory element 61b is a dynamic random access memory (DRAM).

The processing unit 61a and the memory element 61b are mounted on the six-layer substrate 60. The six-layer substrate 60 is a multilayer substrate in which six wiring layers L1 to L6 are stacked.

A plurality of wiring patterns 7 are formed in the six wiring layers L1 to L6. The use of the six-layer substrate 60 contributes to downsizing of the signal processing board 6.

The plurality of wiring patterns 7 are electrically connected to one or both of the processing unit 61a and the memory element 61b.

By the way, the signal processing board 6 operates in a normal mode or a power saving mode. In the normal mode, power is supplied to the processing unit 61a, and in the power saving mode, power supply to the processing unit 61a is stopped.

The signal processing board 6 can control the printing device 1 when operating in the normal mode. The power consumption of the signal processing board 6 is smaller when the signal processing board 6 operates in the power saving mode than when the signal processing board 6 operates in the normal mode.

The signal processing board 6 shifts from the normal mode to the power saving mode when a standby condition is satisfied. For example, the standby condition is a condition that a state where no print request is received continues for a predetermined period of time.

The signal processing board 6 returns from the power saving mode to the normal mode when receiving the print request from the host device 8 through the communication device 5 while operating in the power saving mode.

Further, the signal processing board 6 returns from the power saving mode to the normal mode when the activation switch 3 detects an operation while the signal processing board 6 is operating in the power saving mode.

The activation switch 3 is an operation switch for detecting a user's operation. The activation switch 3 detects an operation for shifting the signal processing board 6 from the power saving mode to the normal mode.

The signal processing board 6 of the image forming apparatus 10 requires two types of power supply patterns. One of the two types of power supply patterns is de-energized in the power saving mode.

When the signal processing board 6 includes two types of power supply patterns, there is a demand to downsize the signal processing board 6 and reduce noise by devising the arrangement of the plurality of wiring patterns 7.

The signal processing board 6 has a configuration for achieving downsizing and noise reduction. Hereinafter, the configuration will be described.

[Configuration of Signal Processing Board 6]

In the six-layer substrate 60 of the signal processing board 6, the six wiring layers L1 to L6 include a first layer L1, a second layer L2, a third layer L3, a fourth layer L4, a fifth layer L5, and a sixth layer L6 (see FIG. 2).

Figure 3:
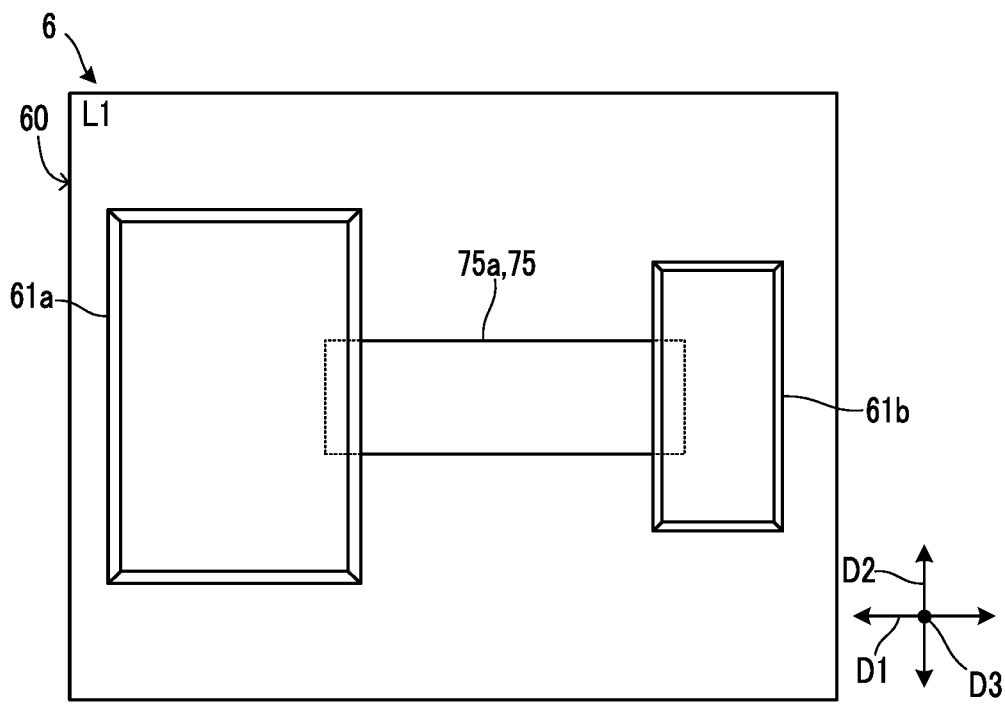
FIG. 3 is a diagram schematically showing a wiring layout of a first layer of the signal processing board according to the embodiment.

The processing unit 61a and the memory element 61b are mounted on the outer surface of the first layer L1 of the six-layer substrate 60 (see FIG. 2 and FIG. 3). The processing unit 61a is an example of a first semiconductor element. The memory element 61b is an example of a second semiconductor element.

In FIG. 2 to FIG. 8, the first direction D1 is a direction in which the processing unit 61a and the memory element 61b are arranged. The processing unit 61a and the memory element 61b are spaced apart in the first direction D1.

In FIG. 2 to FIG. 8, the second direction D2 is a direction orthogonal to the first direction D1. The first direction D1 and the second direction D2 are along the surface of the six-layer substrate 60.

In the present embodiment, the processing unit 61a and the memory element 61b each have a rectangular shape with the second direction D2 as the longitudinal direction (see FIG. 3).

The length of the memory element 61b in the second direction D2 is shorter than the length of the processing unit 61a in the second direction D2. The memory element 61b is arranged within an area in the second direction D2 occupied by the processing unit 61a.

In FIG. 2 to FIG. 8, the third direction D3 is a stacking direction of the six wiring layers L1 to L6. That is, the third direction D3 is the thickness direction of the six-layer substrate 60. The third direction D3 is orthogonal to the first direction D1 and the second direction D2.

In FIG. 4 to FIG. 8, the positions of the processing unit 61a and the memory element 61b when the six-layer substrate 60 is viewed along the third direction D3 are indicated by imaginary lines (dash-dot-dot-dash lines).

The plurality of wiring patterns 7 include a first ground pattern 71, a second ground pattern 72, a first power supply pattern 73, a second power supply pattern 74, and a plurality of signal transmission patterns 75.

The plurality of signal transmission patterns 75 are formed in the first layer L1, the third layer L3, the fourth layer L4, and the sixth layer L6 (see FIG. 2, FIG. 3, FIG. 5, FIG. 6, and FIG. 8). The plurality of signal transmission patterns 75 are electrically connected to signal terminals of one or both of the processing unit 61a and the memory element 61b.

The plurality of signal transmission patterns 75 include a first signal transmission pattern 75a formed in the first layer L1, a second signal transmission pattern 75b formed in the third layer L3, a third signal transmission pattern 75c formed in the fourth layer L4, and a fourth signal transmission pattern 75*d* formed in the sixth layer L6 (see FIG. 3, FIG. 5, FIG. 6, and FIG. 8).

The first signal transmission pattern 75*a* of the first layer L1 is formed within an area in the first direction D1 over a part of the processing unit 61*a* and a part of the memory element 61*b* when viewed along the third direction D3 (see FIG. 3).

In addition, the first signal transmission pattern 75*a* is formed within an area in the second direction D2 occupied by the processing unit 61*a* and the memory element 61*b* when viewed along the third direction D3 (see FIG. 3).

Figure 5:
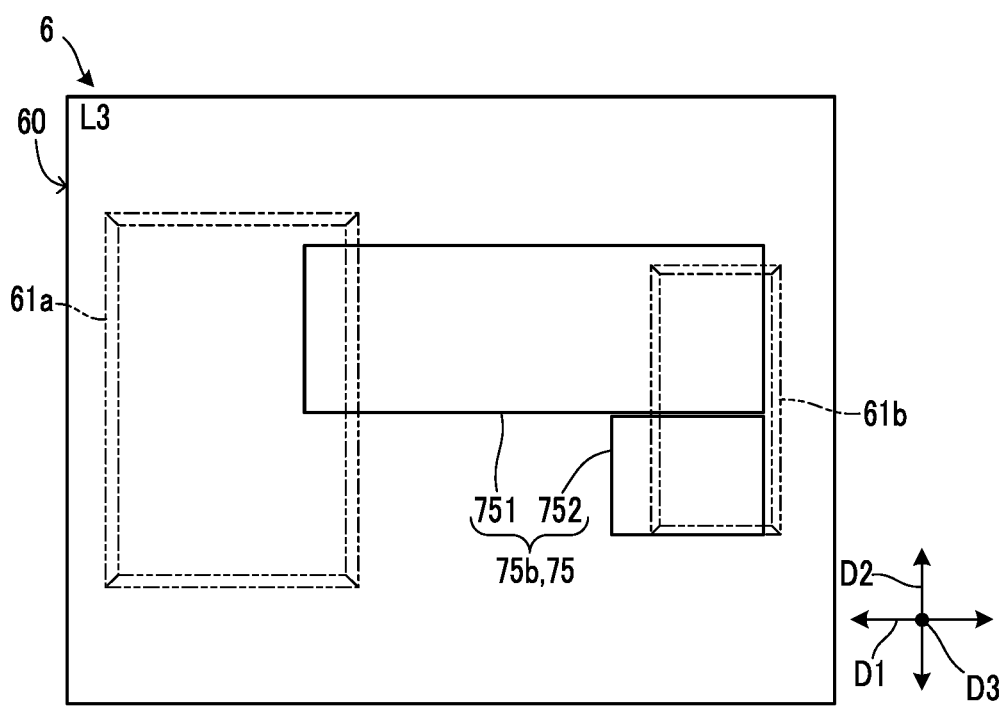
FIG. 5 is a diagram schematically showing a wiring layout of a third layer of the signal processing board according to the embodiment.

The second signal transmission pattern 75*b* of the third layer L3 includes a long signal pattern 751 and a short signal pattern 752 formed side by side in the second direction D2 (see FIG. 5).

The long signal pattern 751 is formed in the first direction D1 over a part of the processing unit 61*a* and a part of the memory element 61*b* when viewed along the third direction D3 (see FIG. 5). The long signal pattern 751 is not connected to the patterns of the layers other than the third layer L3.

In addition, the long signal pattern 751 is formed within an area in the second direction D2 occupied by the processing unit 61*a* when viewed along the third direction D3 (see FIG. 5).

The short signal pattern 752 is formed within an area overlapping with a part of the memory element 61*b* in the first direction D1 when viewed along the third direction D3 (see FIG. 5). The short signal pattern 752 is connected to the fourth signal transmission pattern 75*d* of the sixth layer L6 by a through electrode (not shown).

In addition, the short signal pattern 752 is formed within an area in the second direction D2 occupied by the processing unit 61*a* when viewed along the third direction D3 (see FIG. 5).

Figure 6:
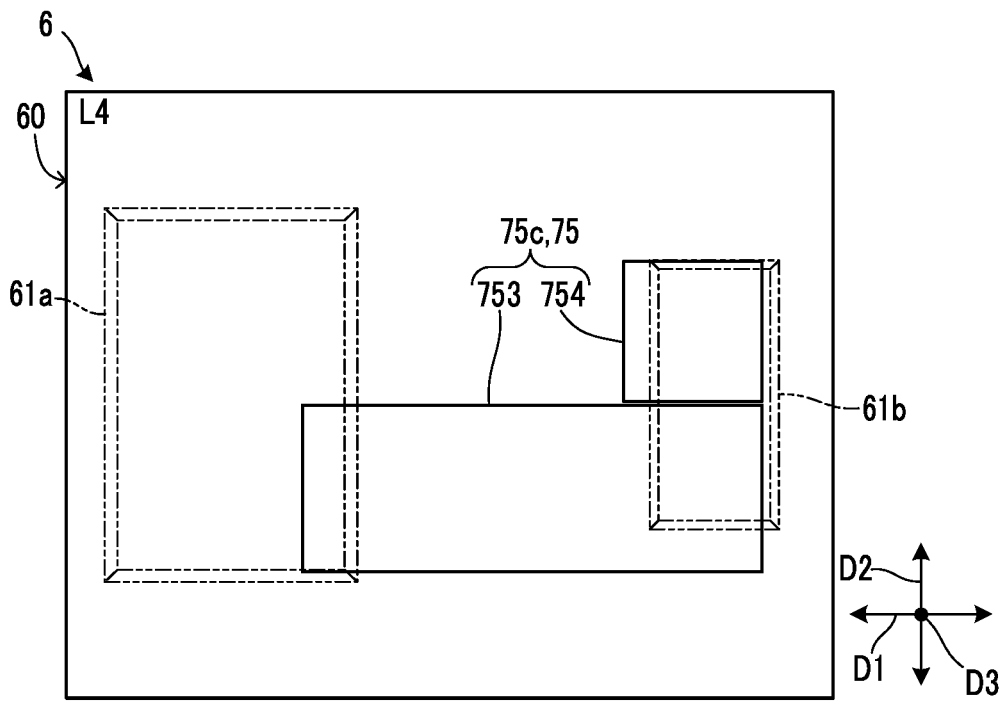
FIG. 6 is a diagram schematically showing a wiring layout of a fourth layer of the signal processing board according to the embodiment.

The third signal transmission pattern 75*c* of the fourth layer L4 includes a long signal pattern 753 and a short signal pattern 754 formed side by side in the second direction D2 (see FIG. 6).

The long signal pattern 753 is formed in the first direction D1 over a part of the processing unit 61*a* and a part of the memory element 61*b* when viewed along the third direction D3 (see FIG. 6). The long signal pattern 753 is not connected to the patterns of the layers other than the fourth layer L4.

In addition, the long signal pattern 753 is formed within an area in the second direction D2 occupied by the processing unit 61*a* when viewed along the third direction D3 (see FIG. 6).

The short signal pattern 754 is formed within an area overlapping with a part of the memory element 61*b* in the first direction D1 when viewed along the third direction D3 (see FIG. 6). The short signal pattern 754 is connected to the fourth signal transmission pattern 75*d* of the sixth layer L6 by a through electrode (not shown).

In addition, the short signal pattern 754 is formed within an area in the second direction D2 occupied by the processing unit 61*a* when viewed along the third direction D3 (see FIG. 6).

Figure 8:
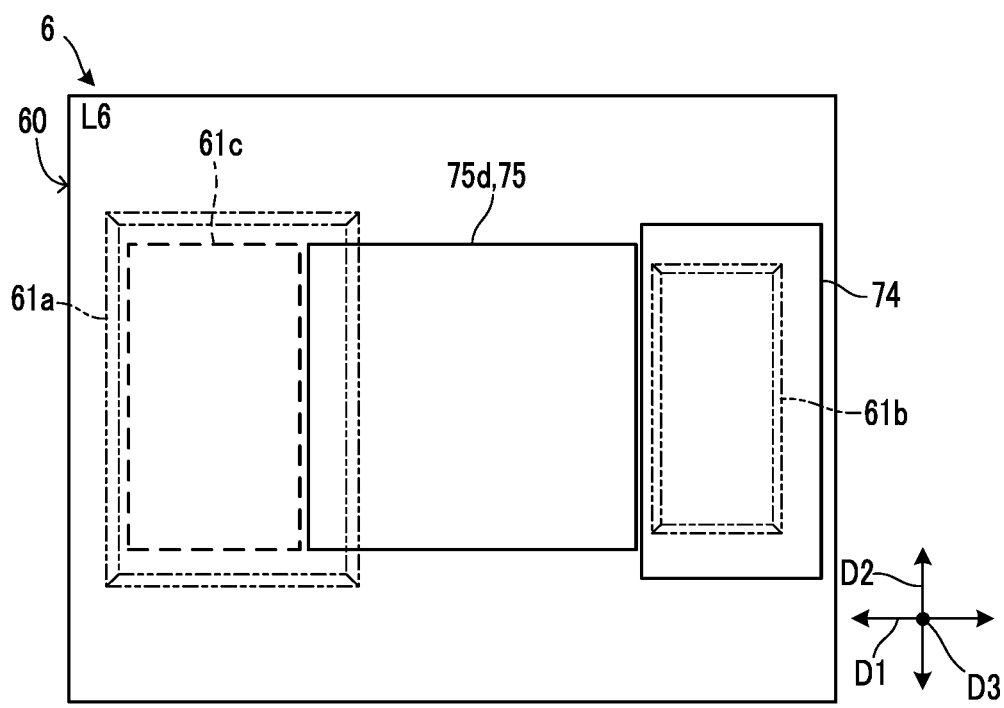
FIG. 8 is a diagram schematically showing a wiring layout of a sixth layer of the signal processing board according to the embodiment.

The fourth signal transmission pattern 75*d* of the sixth layer L6 is formed in an area overlapping with a part of the processing unit 61*a* and not overlapping with a part of the memory element 61*b* in the first direction D1 when viewed along the third direction D3 (see FIG. 8).

In addition, the fourth signal transmission pattern 75*d* is formed within an area in the second direction D2 occupied by the processing unit 61*a* when viewed along the third direction D3 (see FIG. 8).

Figure 4:
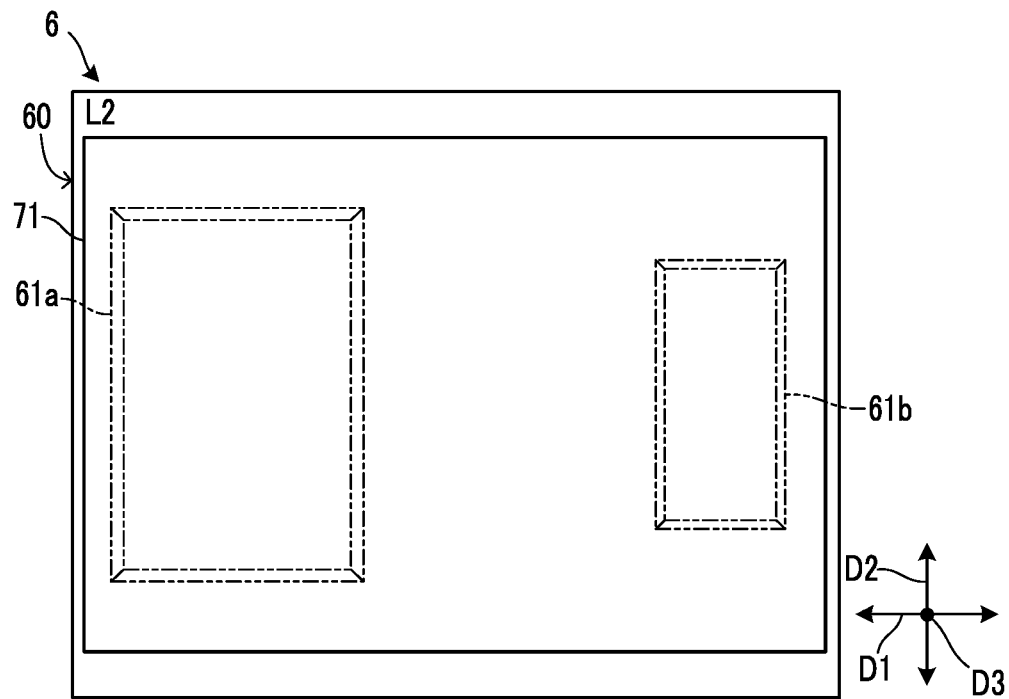
FIG. 4 is a diagram schematically showing a wiring layout of a second layer of the signal processing board according to the embodiment.

The first ground pattern 71 is formed in the second layer L2 (see FIG. 2 and FIG. 4). The first ground pattern 71 is electrically connected to the ground terminal of each of the processing unit 61*a* and the memory element 61*b*. The first ground pattern 71 is connected to the processing unit 61*a* and the memory element 61*b* by through electrodes 76 (see FIG. 2).

The first ground pattern 71 is formed within an area including the processing unit 61*a* and the memory element 61*b* when viewed along the third direction D3 (see FIG. 4).

Figure 7:
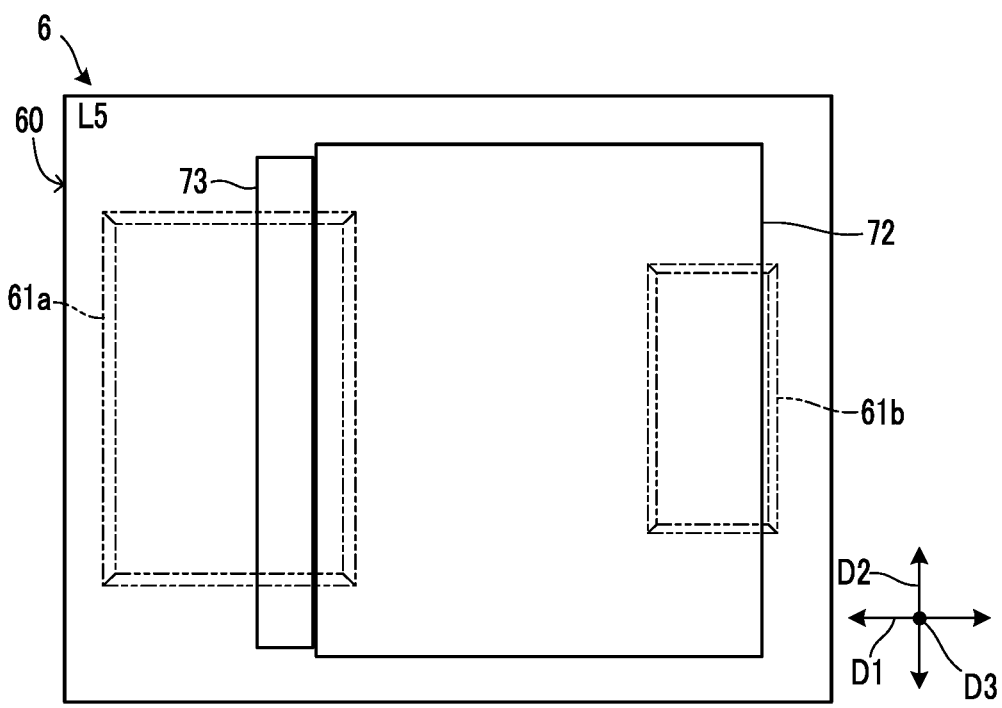
FIG. 7 is a diagram schematically showing a wiring layout of a fifth layer of the signal processing board according to the embodiment.

The second ground pattern 72 is formed in the fifth layer L5 (see FIG. 2 and FIG. 7). The second ground pattern 72 is electrically connected to the ground terminal of each of the processing unit 61*a* and the memory element 61*b*. The second ground pattern 72 is connected to the processing unit 61*a* and the memory element 61*b* by through electrodes 77 (see FIG. 2).

The second ground pattern 72 is formed in the first direction D1 over a part of the processing unit 61*a* and a part of the memory element 61*b* when viewed along the third direction D3 (see FIG. 7).

The second ground pattern 72 is formed within an area wider in the second direction D2 than the area occupied by each of the processing unit 61*a* and the memory element 61*b* when viewed along the third direction D3 (see FIG. 7).

The first power supply pattern 73 is formed in the fifth layer L5 (see FIG. 2 and FIG. 7). The first power supply pattern 73 is electrically connected to a power supply terminal of the processing unit 61*a*. The first power supply pattern 73 is connected to the processing unit 61*a* by a through electrode 78 (see FIG. 2).

The first power supply pattern 73 is formed within an area in the first direction D1 occupied by the processing unit 61*a* when viewed along the third direction D3 (see FIG. 7). The first power supply pattern 73 and the second ground pattern 72 are formed side by side in the first direction D1.

The first power supply pattern 73 is formed within an area wider in the second direction D2 than the area occupied by the processing unit 61*a* when viewed along the third direction D3 (see FIG. 7).

The second power supply pattern 74 is formed in the sixth layer L6. The second power supply pattern 74 is electrically connected to a power supply terminal of the memory element 61*b* (see FIG. 8). The second power supply pattern 74 is connected to the memory element 61*b* by a through electrode 79 (see FIG. 2).

The second power supply pattern 74 is formed within an area including the memory element 61*b* when viewed in the third direction D3 (see FIG. 8). The second power supply pattern 74 and the fourth signal transmission pattern 75*d* are formed side by side in the first direction D1.

The use of the six-layer substrate 60 contributes to downsizing of the signal processing board 6.

In the signal processing board 6, the power supply to the first power supply pattern 73 is cut off in the power saving mode. On the other hand, the power supply to the second power supply pattern 74 is maintained in both the normal mode and the power saving mode.

The first power supply pattern 73 and the second power supply pattern 74 are each formed in a relatively narrow area because they have different connection destinations (see FIG. 7 and FIG. 8). Therefore, the first power supply pattern 73 and the second power supply pattern 74 do not function as return paths of the plurality of signal transmission patterns 75.

On the other hand, the first ground pattern 71 of the second layer L2 functions as a return path of the first signal transmission pattern 75a of the first layer L1 and the second signal transmission pattern 75b of the third layer L3.

Further, the second ground pattern 72 of the fifth layer L5 functions as a return path of the third signal transmission pattern 75c of the fourth layer L4 and the fourth signal transmission pattern 75d of the sixth layer L6.

By arranging the first ground pattern 71, the second ground pattern 72, and the plurality of signal transmission patterns 75 as shown in FIG. 2, noise in the signal processing board 6 is reduced.

In addition, among the six wiring layers L1 to L6, the first layer L1 and the third layer L3 are layers relatively close to the processing unit 61a and the memory element 61b. Therefore, high-frequency signals such as a clock signal are mainly assigned to the first signal transmission pattern 75a and the second signal transmission pattern 75b.

Therefore, it is difficult to secure a space for arranging the first power supply pattern 73 and the second power supply pattern 74 in the first layer L1 or the third layer L3.

Accordingly, it is preferable that the first power supply pattern 73 is formed in one of the fourth layer L4, the fifth layer L5, and the sixth layer L6. Similarly, it is preferable that the second power supply pattern 74 is formed in one of the fourth layer L4, the fifth layer L5, and the sixth layer L6.

In general, other components 61c including a capacitor and the like are often mounted on the outer surface of the sixth layer L6 in an area overlapping the processing unit 61a when viewed along the third direction D3 (see FIG. 2 and FIG. 8).

When the other components 61c are mounted on the outer surface of the sixth layer L6, it is difficult to secure a space for arranging the first power supply pattern 73 corresponding to the processing unit 61a in the sixth layer L6. In this case, it is preferable that the first power supply pattern 73 is formed in the fourth layer L4 or the fifth layer L5.

In addition, in the signal processing board 6, the first power supply pattern 73 and the second power supply pattern 74 are formed in different layers. This avoids a lack of arrangement space for either the third signal transmission pattern 75c, the second ground pattern 72, or the fourth signal transmission pattern 75d.

It is to be understood that the embodiments herein are illustrative and not restrictive, since the scope of the disclosure is defined by the appended claims rather than by the description preceding them, and all changes that fall within metes and bounds of the claims, or equivalence of such metes and bounds thereof are therefore intended to be embraced by the claims.

The invention claimed is:

1. A signal processing board comprising:
a six-layer substrate in which six wiring layers are stacked;
a first semiconductor element and a second semiconductor element mounted on an outer surface of a first layer of the six wiring layers;
a plurality of signal transmission patterns formed in the first layer, a third layer, a fourth layer, and a sixth layer of the six wiring layers and electrically connected to one or both of the first semiconductor element and the second semiconductor element;
a first ground pattern formed in a second layer of the six wiring layers and electrically connected to the first semiconductor element and the second semiconductor element;
a second ground pattern formed in a fifth layer of the six wiring layers and electrically connected to the first semiconductor element and the second semiconductor element;
a first power supply pattern formed in one of the fourth layer, the fifth layer, and the sixth layer of the six wiring layers and electrically connected to the first semiconductor element; and
a second power supply pattern formed in one of the fourth layer, the fifth layer, and the sixth layer of the six wiring layers and electrically connected to the second semiconductor element.

2. The signal processing board according to claim 1, wherein
the first semiconductor element is an element including a processor, and
the second semiconductor element is a memory element.

3. The signal processing board according to claim 2, wherein
another component mounted on an outer surface of the sixth layer in an area overlapping with the first semiconductor element when viewed in a stacking direction of the six wiring layers, and
the first power supply pattern is formed in the fourth layer or the fifth layer.

4. An image forming apparatus comprising:
a printing device configured to form an image on a sheet; and
the signal processing board according to claim 2, on which a memory element and an element including a processor configured to control the printing device are mounted.

* * * * *